(12) United States Patent
Bullen

(10) Patent No.: US 11,489,082 B2
(45) Date of Patent: Nov. 1, 2022

(54) DURABLE SOLAR PANELS

(71) Applicant: EPIC BATTERY INC., Santa Clara, CA (US)

(72) Inventor: Melvin James Bullen, Los Gatos, CA (US)

(73) Assignee: EPIC BATTERY INC., Santa Clara, CA (US)

( * ) Notice: Subject to any disclaimer, the term of this patent is extended or adjusted under 35 U.S.C. 154(b) by 45 days.

(21) Appl. No.: 16/943,887

(22) Filed: Jul. 30, 2020

(65) Prior Publication Data

US 2021/0036174 A1 Feb. 4, 2021

Related U.S. Application Data

(60) Provisional application No. 62/880,563, filed on Jul. 30, 2019.

(51) Int. Cl.
*H01L 31/048* (2014.01)
*H01L 31/02* (2006.01)

(52) U.S. Cl.
CPC .... *H01L 31/0488* (2013.01); *H01L 31/02013* (2013.01); *H01L 31/0481* (2013.01)

(58) Field of Classification Search
CPC .............. H01L 31/0488; H01L 31/048; H01L 31/02013
See application file for complete search history.

(56) References Cited

U.S. PATENT DOCUMENTS

| | | | |
|---|---|---|---|
| 389,124 A | 9/1888 | Weston | |
| 1,862,559 A | 6/1932 | White | |
| 2,396,419 A | 3/1946 | Hassel | |
| D171,628 S | 3/1954 | Weddell | |
| 3,123,321 A | 3/1964 | Custer | |
| 3,696,283 A | 10/1972 | Ackley, III | |
| 4,083,097 A | 4/1978 | Anagnostou | |

(Continued)

FOREIGN PATENT DOCUMENTS

| CN | 103481772 A | 1/2014 |
|---|---|---|
| CN | 205452361 U | 8/2016 |

(Continued)

OTHER PUBLICATIONS

Wikipedia, "Shockley-Queisser Limitation," 1961; retrieved from the Internet on Sep. 26, 2016; 14 pages.

(Continued)

*Primary Examiner* — Christina Chern

(74) *Attorney, Agent, or Firm* — Schwabe, Williamson & Wyatt, P.C.

(57) ABSTRACT

Embodiments provide solar panels and methods of assembly thereof, permitting operation of a photovoltaic material with reduced degradation. As one example, a solar panel comprises one or more solar cells that include perovskite, the one or more solar cells encapsulated by a film and housed in a glass exterior that is hermetically sealed to maintain a vacuum in an interior of the solar panel of $10^{-7}$ Pascal or less throughout a lifetime of the solar panel. In this way, degradation of the solar panel due to water ingress can be avoided, thereby increasing an operational lifetime of perovskite-based solar panels and reducing manufacturing costs as compared to silicon-based counterparts.

11 Claims, 8 Drawing Sheets

(56) References Cited

U.S. PATENT DOCUMENTS

| | | | |
|---|---|---|---|
| 4,170,507 A | 10/1979 | Keeling | |
| 4,374,955 A | 2/1983 | Gupta | |
| 4,383,129 A | 5/1983 | Gupta | |
| 4,563,727 A | 1/1986 | Curiel | |
| 4,592,436 A | 6/1986 | Tomei | |
| 4,692,557 A | 9/1987 | Samuelson | |
| 4,832,755 A | 5/1989 | Barton | |
| 4,857,095 A | 8/1989 | Brown | |
| 5,022,930 A * | 6/1991 | Ackerman | H01L 31/03925 438/66 |
| 5,138,699 A | 8/1992 | Minor | |
| 5,202,211 A | 4/1993 | Vercoulen | |
| 5,238,674 A | 8/1993 | Vercoulen | |
| 5,273,608 A | 12/1993 | Nath | |
| 5,582,653 A | 12/1996 | Kataoka | |
| 5,608,385 A | 3/1997 | Masaki | |
| 5,668,424 A | 9/1997 | Lamb | |
| 5,707,459 A | 1/1998 | Itoyama | |
| 5,848,904 A | 12/1998 | Kikuchi | |
| 6,005,317 A | 12/1999 | Lamb | |
| 6,042,806 A | 3/2000 | Bedard | |
| 6,078,165 A | 6/2000 | Ashtiani | |
| 6,204,139 B1 | 3/2001 | Liu | |
| 6,268,059 B1 | 7/2001 | Cronin | |
| 6,366,739 B1 | 4/2002 | Yoshihara | |
| 6,551,741 B1 | 4/2003 | Hamada | |
| 6,660,930 B1 | 12/2003 | Gonsiorawski | |
| 6,668,444 B2 | 12/2003 | Ngo | |
| 6,685,882 B2 | 2/2004 | Deevi | |
| 6,745,977 B1 | 6/2004 | Long | |
| D630,162 S | 1/2011 | Bullen | |
| 8,373,191 B2 | 2/2013 | Ide | |
| 8,421,400 B1 | 4/2013 | Khanna | |
| 8,487,778 B2 | 7/2013 | Kang | |
| 8,505,351 B2 | 8/2013 | Klatt | |
| 8,531,152 B2 | 9/2013 | Blau | |
| 8,629,646 B2 | 1/2014 | Bullen | |
| 8,701,800 B2 | 4/2014 | Hui | |
| 8,753,918 B2 | 6/2014 | Varghese | |
| 8,851,560 B1 | 10/2014 | Freeman | |
| 8,946,113 B2 | 2/2015 | Moon | |
| 9,054,249 B2 | 6/2015 | Chaudhari | |
| 9,312,424 B1 * | 4/2016 | Hensel | H01L 31/048 |
| 9,543,537 B2 | 1/2017 | Steirer | |
| 9,608,159 B2 | 3/2017 | Chaudhari | |
| 10,340,458 B2 | 7/2019 | Gong | |
| 10,457,148 B2 | 10/2019 | Bullen | |
| 10,587,221 B2 | 3/2020 | Bullen | |
| 2002/0086446 A1 | 7/2002 | Charpentier | |
| 2005/0133085 A1 | 6/2005 | Shimada | |
| 2005/0243345 A1 | 11/2005 | Foehr | |
| 2006/0253356 A1 | 11/2006 | Charles | |
| 2007/0007240 A1 | 1/2007 | Wise | |
| 2007/0087266 A1 | 4/2007 | Bourke | |
| 2007/0273327 A1 | 11/2007 | Daniel | |
| 2007/0295389 A1 | 12/2007 | Capps | |
| 2008/0235156 A1 | 9/2008 | Amodeo | |
| 2009/0053511 A1 | 2/2009 | Kim | |
| 2009/0288890 A1 | 11/2009 | Freeman | |
| 2009/0309893 A1 | 12/2009 | Boothroyd | |
| 2010/0096004 A1 | 4/2010 | Hu | |
| 2010/0173188 A1 | 7/2010 | Dhawan | |
| 2010/0193260 A1 | 8/2010 | Freeman | |
| 2010/0198754 A1 | 8/2010 | Jones | |
| 2010/0235219 A1 | 9/2010 | Merrick | |
| 2010/0320958 A1 | 12/2010 | Kawitt | |
| 2011/0129676 A1 | 6/2011 | Bravet | |
| 2011/0146794 A1 | 6/2011 | Tsai | |
| 2011/0200867 A1 | 8/2011 | Culver | |
| 2011/0297459 A1 | 12/2011 | Hayek | |
| 2012/0028098 A1 | 2/2012 | Meehan | |
| 2012/0060910 A1 | 3/2012 | Schoenfeld | |
| 2012/0070934 A1 | 3/2012 | Mitra | |
| 2012/0080753 A1 | 4/2012 | Singh | |
| 2012/0183832 A1 | 7/2012 | Culver | |
| 2012/0186623 A1 | 7/2012 | Bulovic | |
| 2012/0229067 A1 | 9/2012 | Barbero | |
| 2013/0043826 A1 | 2/2013 | Workman | |
| 2013/0099765 A1 | 4/2013 | Girard | |
| 2013/0126666 A1 | 5/2013 | Brown | |
| 2013/0236764 A1 | 9/2013 | Hu | |
| 2014/0093734 A1 | 4/2014 | Mogi | |
| 2014/0130864 A1 | 5/2014 | Lunt | |
| 2014/0252342 A1 | 9/2014 | Ramadas et al. | |
| 2014/0283896 A1 | 9/2014 | Lunt, III | |
| 2015/0053258 A1 | 2/2015 | Beck | |
| 2015/0060743 A1 | 3/2015 | Yashima | |
| 2015/0144196 A1 | 5/2015 | Irwin | |
| 2015/0199062 A1 | 7/2015 | Lang | |
| 2015/0256026 A1 | 9/2015 | Rybkiewicz | |
| 2015/0311504 A1 | 10/2015 | Hong et al. | |
| 2015/0345006 A1 | 12/2015 | Uprety | |
| 2015/0357591 A1 | 12/2015 | Karunadasa | |
| 2016/0133672 A1 | 5/2016 | Koposov | |
| 2016/0163904 A1 | 6/2016 | Mailoa | |
| 2016/0176256 A1 | 6/2016 | Gandhi | |
| 2016/0289867 A1 | 10/2016 | Ozcan | |
| 2016/0322172 A1 | 11/2016 | Chaudhari | |
| 2016/0322509 A1 | 11/2016 | Singh | |
| 2016/0339160 A1 | 11/2016 | Bedworth et al. | |
| 2016/0351841 A1 | 12/2016 | Suzuka | |
| 2017/0018372 A1 | 1/2017 | Fujimura | |
| 2017/0084400 A1 | 3/2017 | Cheng | |
| 2017/0104440 A1 | 4/2017 | Sakabe | |
| 2017/0125172 A1 | 5/2017 | Gong | |
| 2017/0309407 A1 | 10/2017 | Suzuka | |
| 2018/0010039 A1 | 1/2018 | Dong | |
| 2018/0175112 A1 | 6/2018 | Robinson | |
| 2018/0244160 A1 | 8/2018 | Bullen | |
| 2018/0248061 A1 | 8/2018 | Bullen | |
| 2018/0294771 A1 | 10/2018 | Bullen | |
| 2019/0006547 A1 | 1/2019 | Watts | |

FOREIGN PATENT DOCUMENTS

| | | |
|---|---|---|
| CN | 106229327 A | 12/2016 |
| EP | 2523246 A1 | 11/2012 |
| EP | 2634146 A1 | 9/2013 |
| EP | 2693503 A1 | 2/2014 |
| WO | 1998/057414 A1 | 12/1998 |
| WO | 2001/072652 A1 | 10/2001 |
| WO | 2005/060624 A2 | 7/2005 |
| WO | 2013/119113 A1 | 8/2013 |
| WO | 2014/045021 A1 | 3/2014 |
| WO | 2014/097299 A1 | 6/2014 |
| WO | 2015/031944 A1 | 3/2015 |
| WO | 2016/152704 A1 | 9/2016 |
| WO | 2018/156987 A1 | 8/2018 |
| WO | 2018/187384 A1 | 10/2018 |
| WO | 2018/191756 A2 | 10/2018 |

OTHER PUBLICATIONS

Microchip, Inc., "PIC32MZ Embedded Connectivity with Floating Point Unit {EF} Family," Technical Documentation; J015; 736 pages. (uploaded in multiple parts).

Green Hills, Inc., "Integrity Real-Time Operating System", 2015, retrieved from the Internet on Oct. 2, 2016 from http://www.ghs.com/products.rtos.integrity.html; 4 pages.

DuPont Creative Mechanisms, "Everything You Need to Know About Polycarbonate," 2015; retrieved from the internet on Sep. 26, 2016 from https://www.creativemechanisms.com/blog/everything-you-need-to-know-about-polycarbonate-pc.

DuPont USA, DuPont Frontsheet Materials, DuPont Teflon Films {Teflon Fluoropolymer), 2015; K23269 Sep. 2009; 4 pages.

Power Stream Technology, American Wire Gauge "Wire Gauge and Current Limits Including Skin Depth and Strength" Nov. 12, 2015; 6 pages.

Maxim, MAX1740 Data Sheet "SIM/Smart Card Level Translators in μMAX," 19-1458; 19-1458: Rev O; Jan. 2000; 2000; 12 pages.

Wikipedia, "Fick's Laws of Diffusion," 1855; retrieved from the Internet on Oct. 5, 2016; 11 pages.

(56) References Cited

OTHER PUBLICATIONS

Fan et al., Microelectronics Reliability, "Experimental investigations and model study of moisture behaviors in polymeric materials," vol. 49, Issue 8, Aug. 2009; 12 pages.
Stanford News, "New perovskite solar cell design could outperform existing commercial technologies, Stanford and Oxford scientists report," Oct. 2016; retrieved from the internet on Nov. 7, 2016 from <http://news.stanford. du/2016/10/20/perovskite-solar-cell-design-shows-promise>.
The Orange solar charger by JOOS; 6 pages; downloaded from the Internet on Apr. 25, 2018 at <http://solarjoos.com/ products>.
Kempe et al., National Renewable Energy Laboratory, "Calcium Based Test Method for Evaluation of Photovoltaic Edge-Seal Materials," 2011 NREL PV Module Reliability Workshop; Feb. 16, 2011; 21 pages.
Honeywell Aclar® Films, "Honeywell Aclar® UltRx6000", effective date Sep. 19, 2011; 1 page.
Wikipedia, "Artificial Sunlight," retrieved from the Internet on Sep. 27, 2016; 3 pages.
Meek, et al. "Clothoid Spline Transition Spirals" Mathematics of Computation, vol. 59, No. 199; Jul. 1992; pp. 117-133.
Liu et al., "Figure 1: Device architecture and energy-level diagram" Nature Photonics 8, (2014); 3 pages.
Dyesol Materials Catalogue (2016); 44 pages; retrieved from the Internet from <http://3d-nano.com/wp-content/ uploads/2016/09/Dyesol-Material-Catalogue.pdf>.
Petropoulos et al., "Beyond Fick: How Best to Deal with non-Fickian Behavior in a Fickian Spirit" Diffusion—rundamentals.org 11 (2009) 5; 21 pages.
Gehlhaar et al., Solar & Alternative Energy Perovskite solar modules with minimal area loss interconnections; Oct. 29, 2015 SPIE Newsroom. Retrieved from the Internet from <http://spie.org/newsroom/6116-perovskite-solar-modules-with-minimal-area-loss-interconnections? ArticleID=x115669>.
Zhang et al., "Highly Efficient Perovskite Solar Cells with Tunable Structural Color"; Nano Letters (2015) vol. 15:1698-1702; DOI: 10.1021/nl504349z.
"Perovskites and Perovskite Solar Cells: An Introduction" Ossila Ltd.; 10 pages; downloaded from the Internet on Oct. 5, 2016 from <http://localhost/Users/jamie/Solarjoos/patents/stable%20perovskite/technical%JOdocumentation/Perovskites%20and%20Perovskite%20Solar"/o20Cells_%20An%1ntroduction%20%E2%80%93%JOOssila.html>.
Wikipedia, "Perovskite solar cell," retrieved from the Internet on Sep. 26, 2016; 14 pages.
Jordan et al. "Photovoltaic Degradation Rates—An Analytical Review," National Renewable Energy Laboratory, Journal article NREUJA—5200-51664; Jun. 2012; 32 pages; available electronically at <http://www.osti.gov/bridge>.
Mitsubishi Engineering—Plastics Corporation; Physicality catalog Chapter 6 "Chemical Properties"; 10 pages; Downloaded from the Internet at <https://www.m-ep.eo.jp/en/pdf/product/iupi_nova/physicality_06.pdf>.
Wikipedia, "Polycarbonate", retrieved from the Internet Sep. 26, 2016; 10 pages.
E Ink Triton "Imaging Film" Technical Spec Sheet; 1 page; retrieved from the Internet on Sep. 4, 2016 from <http://www2.eink.com/sell_sheets/triton_spec_sheet.pdf>.
International Search Report and Written Opinion for PCT/US2018/019566 dated Jun. 26, 2018; 8 pages.
De Looper "Need More Battery on Your Apple Watch?" Downloaded from the Internet at <www.digitaltrends.com/wearables/apple-watch-modular-bands> Mar. 31, 2016.
Bullis "A Battery to Prop Up Renewable Power Hits the Market", Downloaded from the Internet at <https://www.technologyreview.com/s/532311/a-battery-to-prop-up-renewable-power-hits-the-market> Nov. 14, 2014.
Casey "New 'Super Battery' Energy Storage Breakthrough Aims at $54 per kWh", downloaded from the Internet at <https://cleantechnica.com/2016/02/26/new-energy-storage-solution-could-hit-magic-54-mark> Feb. 26, 2016.
Valence "Valence Technology: The first scalable large lithium ion battery pack", downloaded from the Internet at <https://www.valence.com/why-valence/modular> 2016.
Thales "Modular Universal Battery Charger", downloaded from the Internet at <www.thalescomminc.com> 2015.
Tyva Moduloo Inc. "New generation of modular lithiumion polymer batteries", downloaded from the Internet at <http://www.tyva-ennergie.com/en/moduloo-en/home.html> , 2016.
Electronic paper, Wikipedia, downloaded from the Internet at <https://en.wikipedia.org/wiki/Electronic_paper> 2016.
Organic electronics, Wikipedia, downloaded from the Internet at <https://en.wikipedia.org/wiki/Organic-electronics> 2016.
Schwartz, "New perovskite solar cell design could outperform existing commercial technologies, Stanford and Oxford scientists report", www.news.stanford.edu, Oct. 2016; retrieved from the Internet at <https://news.stanford.edu/2016/10/20/perovskite-solar-cell-design-shows-promise/>.
Screw threads, Wikipedia, downloaded from the Internet at <https://en.wikipedia.org/wiki/Screw_thread#Thread_Limit> 2015.
Galvanic corrosion, Wikipedia, downloaded from the Internet at <https://en.wikipedia.org/wiki/Galvanic_corrosion> 2015.
"Waterproofing", SVSeeker, downloaded from the Internet at <http://submarineboat.com/waterproofing/htm> 2016.
Suttman Lithium Ion Battery Aging Experiments and Algorithm Development for Life Estimation, Thesis—Ohio State University, 2011.
Penn Stainless "Duplex 2507 Specifications: UNS S32750", downloaded from the Internet at <www.pennstainless.com> 2016.
VanZwol "Designing Battery Packs for Thermal Extremes", Power Electronics, downloaded from the Internet at <http://powerelectronics.com/print/mobile/designing-battery-packs-thermal-exremes> 2016.
"PIC12 (L) F1571/2 Technical Reference", Microchip, 2016, 334 pages.
Copper Development Association "A Guide to Working with Copper and Copper Alloys", Antimicrobial Copper, Copper Development Association A1360 XX/10, 2017.
Amadeo "Project Ara—Google's modular smartphone—is dead", ARS Technical <www.arstechnica.com>, Sep. 1, 2016.
"Oxygen Free Copper", Copper Development Association, 1968.
Specification for Lithium Battery, Model: CR2032 Product Specification; Power Glory Battery Tech (HK) Co., Ltd., 2012; 9 pages.
Rosu-Hamzescu et al., "Practical Guide for Implementing Solar Panel MPPT Algorithms" Microchip Inc., 2013; 16 pages.
LR44 Technical Data Sheet, Renata Batteries Inc., 2002; 1 page.
"Rural Modular Energy Solution", Leks Environmental Ltd., 2017; <retrieved from the Internet at http://leks-re.com/rural-modular-energy-solution>; 4 pages.
Eveready 1209 Product Datasheet, Form No. EBC-3107F, www.energizer.com (2017); 2 pages.
Lyu, et al. "Organic-inorganic bismuth (III)-based material: a lead-free, air-stable and solution-processable light-absorber beyond organolead perovskites", Tsinghua University Press, Nano Research, Nov. 2015.
Sun et al. "Discovering lead-free perovskite solar materials with a split-anion approach", Royal Society of Chemistry, Nanoscale, Issue 12, 2015.
Shen et al., "Optical absorption, photosensitization, and ultrafast carrier dynamic investigations of CdSe quantum dots grafted onto nanostructured Sn02 electrode and fluorine-doped tin oxide (FTO) glass", Elsevier, Chemical Physical Letters, 442, May 2007.
Eperon et al. "Inorganic caesium lead iodide perovskite solar cells", Royal Society of Chemistry, The Journal of Materials Chemistry, vol. 3 (2015): 19688-19695.
Veldhuis et al. "Perovskite Materials for Light-Emitting Diodes and Lasers", ResearchGate, Advanced Materials, vol. 28 (2016); 6804-6834.
Johnson, "Nanotube based Li-Ion Batteries Can Charge to Near Maximum in Two Minutes", IEEE Spectrum, blog, Oct. 2014.

(56) References Cited

OTHER PUBLICATIONS

Jung et al. "Substantial improvement of perovskite solar cells stability by pinhole-free hole transport layer with doping engineering", Scientific Reports, vol. 5, May 2015; 5 pages.
Azzolini, "Production and Performance of Cu-based anode-supported tubular IT-SOFCs", University of Trento; Doctoral School of Material Science and Engineering, Dec. 2014.
Li et al. "High-efficiency robust perovskite solar cells on ultrathin flexible substrates", Nature Communications, 7:10214, Jan. 2016.
Zhao et al. "Is Cu a stable electrode material in hybrid perovskite solar cells for a 30 year Tifetime?", Energy & Environmental Science, vol. 9 (2016): 3650-3656.
Kato et al. "Silver Iodide Formation in Methyl Ammonium Lead Iodide Perovskite Solar Cells with Silver Top Electrodes", Advanced Materials Interfaces, vol. 2 (2015), 6 pages.
Lee et al. "Neutral- and Multi-Colored Semitransparent Perovskite Solar Cells", MDPI, Molecules, vol. 21, issue 4 (2016), 55 pages.
Boudouris, "Organic Electron Devices", Lecture segment; Nano Hub, Purdue University, Jan. 2015.
Choi et al. "Conjugated polyelectrolyte hole transport layer for inverted-type perovskite solar cells", Nature Communications, vol. 6, issue 7348, Jun. 17, 2015, 6 pages.
Rudati et al. "The I-V characteristics of organic hole-only devices based on cross-linked hole-transport layer", www.sciencedirect.com, Journal of Applied Research and Technology, vol. 13 (2015): 253-260.
Wu et al. "Surface modification of indium tin oxide by plasma treatment: An effective method to improve the efficiency, brightness, and reliability of organic light emitting devices", Princeton University; Department of Electrical Engineering, Advanced Technology Center for Photonic and Optoelectronic Materials, Jan. 1997.
"Aircraft Electrical Wiring Interconnect System (EWIS) Best Practices", Federal Aviation Agency, Job Aid 2.0, 2016; 1 page.
"ASU and Stanford University Team Create High Efficiency Perovskite Silicon Tandem Solar Cell", Perovskite Info, Feb. 2017.
"Custom Neodymium N33UH Magnets", Magnetic Hold Inc., Feb. 2017.
Jeffrey, "Siemens' world-record electric aircraft motor punches above its weight", blog—New Atlas, Apr. 2015, 4 pages.
"Magnetic coupling is 'cheaper than a VSD'", Drives and Controls Magazine, May 2001.
"Neodymium-Iron-Boron Magnet Grades", Arnold Magnetic Technologies Inc., 2017.
"Recoma 35E", Arnold Magnetic Technologies Inc., 2017.
"Magnet" from Wikipedia <https://en.wikipedia.org/wiki/magnet>.
"Neodymium Magnet" from Wikipedia <https://en.wikipedia.org/wiki/Neodymium_magnet>.
"Magnetic Core" from Wikipedia <https://en.wikipedia.org/wiki/Magnetic_core>.
Luomi, "Efficiency Optimization of a 100-W, 500 000-rpm Permanent-Magnet Machine Including Air Friction Losses", IEEE vol. 45, No. 4, Jul./Aug. 2009; 1368-1377.
Petro, "Advanced Materials for Motor Laminations: Past, Present and Future", Metglas Inc., 2014.
"Powerlight Inductor Cores", Hitachi Metals Inc., Technical Bulletin 2016.
De Almeida et al. "VSDs for Electric Motor Systems", University of Coimbra, 2016.
Krings, "Iron Losses in Electrical Machines—Influence of Material Properties, Manufacturing Processes, and Inverter Operation", KTH School of Electrical Engineering, Doctoral Thesis, 2014; 177 pages.
Berman, "Where's the Affordable Carbon Fiber Automobile?" Sustainable Energy, MIT Technology Review, Aug. 10, 2015, 6 pages.
"Carbon-Fiber Composites for Cars", Oak Ridge National Laboratory, 2000.
"List of carbon fiber monocoque cars", Wikipedia, 2017.
Synchronous Optical Network (SONET) Tutorial, Tektronix, 1998 <http://www.webproforum.com/tektronix/full.html>.
Pankaj K. Jha, "Bandwidth Maximization for SONET/SDH and Direct Data over Optical Networks", Cypress Semiconductor, 2017.
"Sustainable, high energy density battery created", City College of New York, 2017.
Chi et al., "Battery Charge Depletion Prediction on an Electric Aircraft", NASA Langley Research Center, 2013.
Jiang, et al., "Modeling charge polarization voltage for large lithium-ion batteries in electric vehicles", Journal of Industrial Engineering and Management, vol. 6, No. 2 (2013); 686-697.
Moldovan et al., "A New 94-GHz Six-Port Collision-Avoidance Radar Sensor", IEEE vol. 52, No. 3, Mar. 2004; 751-759.
"Sintered Neodymium-Iron-Boron Magnets", Arnold Magnetic Technologies Inc., 2017.
Albrecht, et al. "Towards optical optimization of planar monolithic perovskite/silicon-heterojunction tandem solar cells", IOPscience, 2016.
"2016-2017 FIA Formula E Championship Technical Regulations", FIA Sport, 2016.
"Autonomous Decentralized Bearing", www.coo-space.com, 2017.
"World Solar Challenge 2017 Regulations", www.worldsolarchallenge.org, Jun. 2016.
"Vantablack" from Wikipedia; downloaded from the Internet on Jul. 14, 2017 at <https://en.wikipedia.org/wiki/Vantablack>; 4 pages.
"Radio-frequency identification" from Wikipedia; downloaded from the Internet <https://en.wikipedia.org/w/index.php?title=Radio-frequency_identification&oldid=802966994>; (2017) 28 pages.
Patent Cooperation Treaty: International Search Report and Written Opinion for PCT/US2018/025964 dated Aug. 28, 2018; 15 pages.
Patent Cooperation Treaty: International Search Report and Written Opinion for PCT/US2018/027827 dated Aug. 27, 2018; 16 pages.

\* cited by examiner

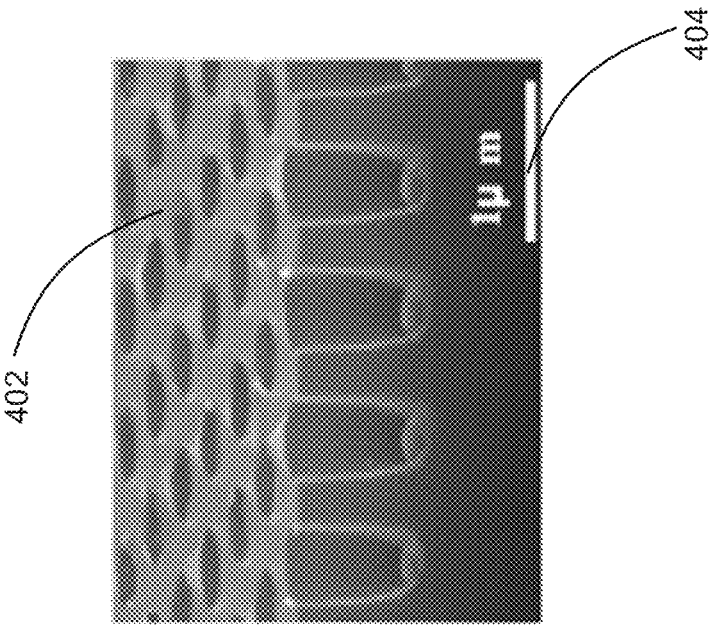
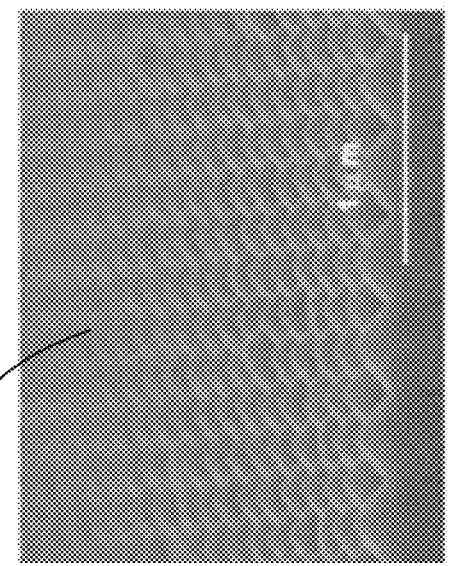

FIG. 7
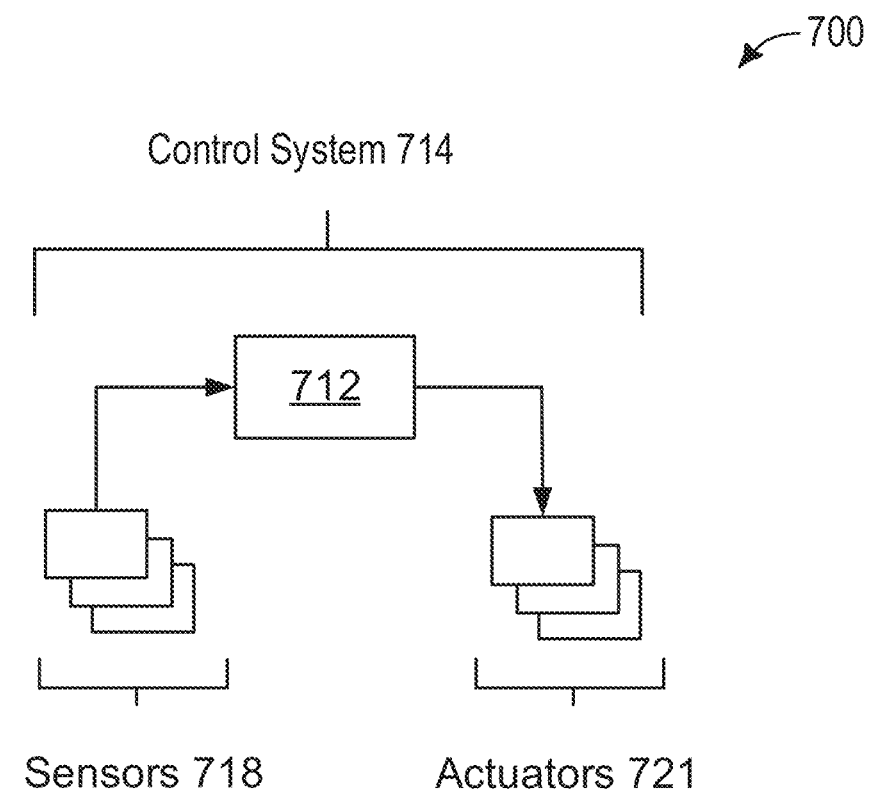
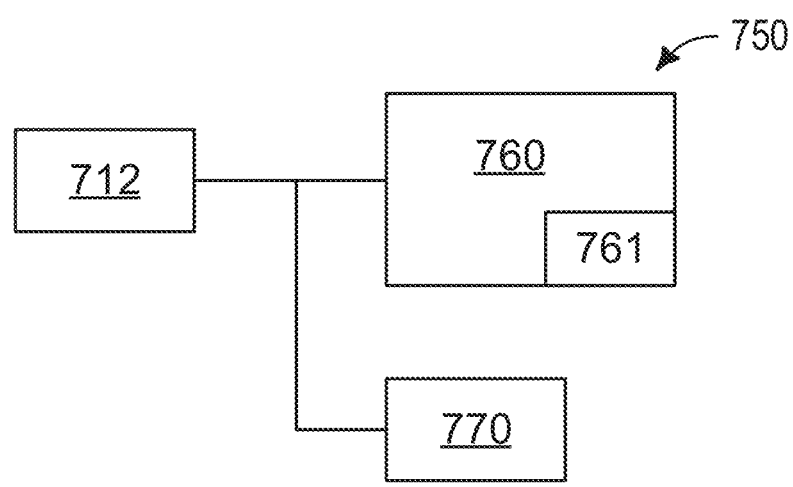

US 11,489,082 B2

DURABLE SOLAR PANELS

CROSS REFERENCE TO RELATED APPLICATION

This application claims the priority benefit of the earlier filing date of U.S. Provisional Application No. 62/880,563, filed Jul. 30, 2019, which is hereby incorporated herein by reference in its entirety.

TECHNICAL FIELD

Embodiments of the invention relate generally to solar panels and their construction, and more specifically, to long-lasting perovskite solar panels.

BACKGROUND

Perovskite solar cells use an inexpensive halide-based material as the light-harvesting layer. The perovskite may include calcium, titanium, and oxygen (e.g., $CaTiO_3$). Perovskite solar cells hold an advantage over traditional silicon solar cells in the simplicity of their processing. For example, silicon cells require an expensive, multistep process. The process is conducted at temperatures greater than 1000° C., in a high vacuum, using a clean room facility. In comparison, a perovskite cell can be manufactured using simple wet chemistry and inexpensive materials. However, a hydrophilic nature of perovskite materials can be problematic when using silicon's regime of stabilization or encapsulation. For example, perovskite panels manufactured using silicon methodology are unable to demonstrate operation over a 30-year time span. The root issue of degraded perovskite stability is delamination of panel layers due to thermal cycling. Such delamination permits water vapor ingress, thereby degrading photovoltaic properties of perovskite panels. The inventors herein have recognized the above-mentioned issues.

BRIEF DESCRIPTION OF THE DRAWINGS

Embodiments will be readily understood by the following detailed description in conjunction with the accompanying drawings and the appended claims. Embodiments are illustrated by way of example and not by way of limitation in the Figures of the accompanying drawings.

FIG. 4A depicts a first glass surface that has been surface prepared using a micro-electro-mechanical systems (MEMS) configuration for laser welding or epoxy fastening of two glass surfaces;

FIG. 4B depicts a second glass surface that has been surface prepared using a MEMS configuration for laser welding or epoxy fastening of two glass surfaces;

FIG. 7 depicts a control system and solar panel assembly system of the present disclosure.

DETAILED DESCRIPTION OF DISCLOSED EMBODIMENTS

Figure 1:
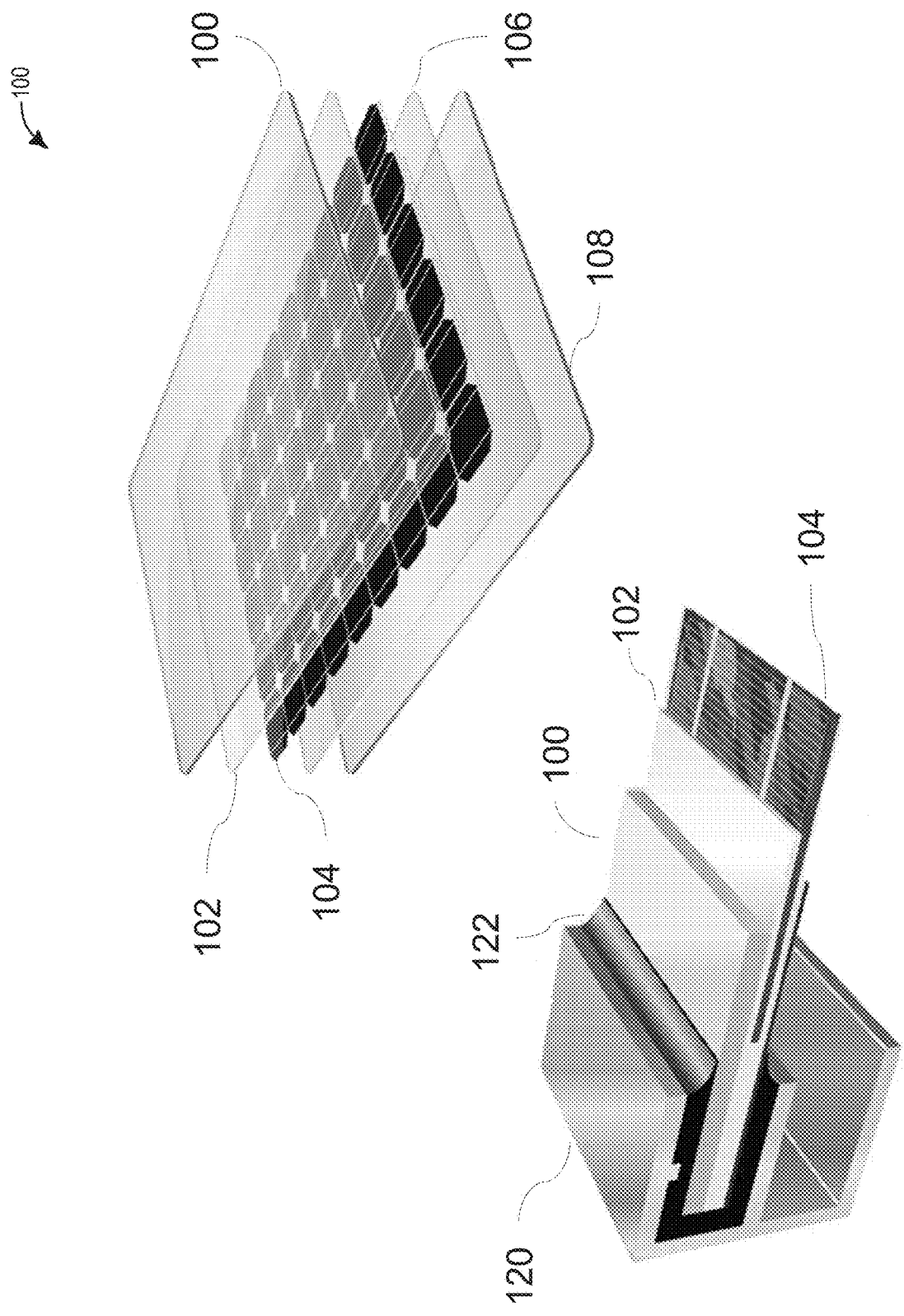
FIG. 1 depicts an example solar panel comprised of silicon solar cells.

In the following detailed description, reference is made to the accompanying drawings, which form a part hereof, and in which are shown by way of illustration embodiments that may be practiced. It is to be understood that other embodiments may be utilized and structural or logical changes may be made without departing from the scope. Therefore, the following detailed description is not to be taken in a limiting sense.

Various operations may be described as multiple discrete operations in turn, in a manner that may be helpful in understanding embodiments; however, the order of description should not be construed to imply that these operations are order-dependent.

The description may use perspective-based descriptions such as up/down, back/front, and top/bottom. Such descriptions are merely used to facilitate the discussion and are not intended to restrict the application of disclosed embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the terms "embodiment" or "embodiments," which may each refer to one or more of the same or different embodiments. Furthermore, the terms "comprising," "including," "having," and the like, as used with respect to embodiments, are synonymous, and are generally intended as "open" terms (e.g., the term "including" should be interpreted as "including but not limited to," the term "having" should be interpreted as "having at least," the term "includes" should be interpreted as "includes but is not limited to," etc.).

With respect to the use of any plural and/or singular terms herein, those having skill in the art can translate from the plural to the singular and/or from the singular to the plural as is appropriate to the context and/or application. The various singular/plural permutations may be expressly set forth herein for sake of clarity.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer implemented method" may refer to any method executed by one or more processors, a computer system having one or more processors, a mobile device such as a smartphone (which may include one or more processors), a tablet, a laptop computer, a set-top box, and so forth.

The architecture of solar panels used in commercial fields has remained relatively constant for decades. In contrast, research into photovoltaic materials has grown considerably. Solar panels for grid scale fields use very pure silicon and perform at close to silicon's operational efficiency limit (24%). Under industrial scale, silicon photovoltaics cost approximately $0.60 per watt. Silicon is a hydrophobic substance and is stabilized or encapsulated using ethyl vinyl acetate (EVA) under glass, with a back sheet, sealants around the edges, and a metal frame. This architecture, with variations, has remained de rigueur due to the requirements of industrial scale manufacturing. The technique used is called roll-to-roll processing and is a continuous manufacturing method. This architecture has worked for decades, and gives an operational lifetime of 30 years, with guaranteed efficiency degradation of no more than 20% during this time frame. Specifically, silicon currently warranties for 10 years at 100% efficiency (e.g., 0-10 years), another 10 years at 90% efficiency (e.g., 10-20 years), and yet another 10 years at 80% (e.g., 20-30 years). Silicon is hydrophobic, so when it gets wet, it slowly degrades. Perovskites, on the other hand, are hydrophilic, hence their ease of manufacture. However, because of their hydrophilic nature they don't degrade but rather their failure is immediate, discussed in greater detail below.

An important discovery in photovoltaics pertains to the Shockley-Queisser (S-Q) limit, also referred to as the detailed balance limit. This refers to the maximum theoretical efficiency of a solar cell using a single p-n junction to collect power from light. The S-Q limit is used to identify promising photovoltaic materials. Perovskites have a slightly lower S-Q limit than silicon, however they are very thin, translucent, and have the useful property that they can be tuned to respond to different frequencies of visible light. This enables multiple cells each absorbing a different color of visible light. These tandem perovskites can achieve an extraordinary theoretical S-Q limit, approaching 68%. Other advantageous aspects of perovskites that are useful is they are abundant, inexpensive, and they dissolve in water (hydrophilic).

A perovskite as disclosed herein is any material with the same type of crystal structure as calcium titanium oxide ($CaTiO_3$), known as the perovskite structure. The general chemical formula for perovskite compounds is $ABX_3$, where A and B are two cations of different sizes, and X is an anion that bonds to both. The A atoms are larger than the B atoms. For the purposes of this disclosure, a perovskite solar cell is a type of solar cell, which includes a perovskite structured compound, most commonly a hybrid organic-inorganic lead or tin halide-based material, as the light-harvesting active layer.

Perovskite materials, such as methylammonium lead halides and all-inorganic cesium lead halide all go into solution readily, making them easy to manufacture and requiring little energy. This contrasts with silicon, which is more expensive in terms of energy to manufacture. However their hydrophilic nature is problematic when using silicon's regime of stabilization or encapsulation. Perovskite panels, manufactured using silicon methodology, are unable to demonstrate operation over a 30-year time span. The root issue of perovskite stability degradation includes delamination of panel layers due to thermal cycling. This delamination permits water vapor ingress, degrading perovskites photovoltaic properties. A new type of solar panel architecture is required that ensures the perovskite material is kept dry for decades (e.g., 30 or more years, such as 50 or more years).

Accordingly, in an embodiment a solar panel comprises one or more photovoltaic cells, and a film that encapsulates the one or more photovoltaic cells. The solar panel may further comprise a glass housing that includes a first portion (e.g., a bottom structure) and a second portion (e.g., a top structure) attached to one another via an interface. For example, the glass housing may include a glass bottom structure having a plurality of glass sides that are integral to a bottom plane of the glass bottom structure. The solar panel may further comprise a glass top structure attached to the glass bottom structure by way of an interface between the plurality of glass sides and a bottom surface of the glass top structure. Alternatively, one or more of the sides or one or more portions of the sides may be structurally integrated with the top plane of the top structure. While embodiments are described herein with respect to a bottom structure with integrated sides and a top structure attached to the sides, it will be apparent that other configurations for manufacturing the glass housing are contemplated.

The one or more photovoltaic cells encapsulated by the film may be enclosed by the glass bottom structure and the glass top structure of the housing. The solar panel may comprise one or more hermetically sealable ports in the glass housing (e.g., the glass bottom structure) for generation of a vacuum in an interior region of the solar panel. The solar panel may additionally or alternatively include one or more hermetically sealable holes in the glass housing (e.g., the glass bottom structure) through which one or more wires couple the photovoltaic cell to an electrical device.

In an example, the solar panel may further comprise one or more glass plugs that fit at least partially into the one or more hermetically sealable ports, to hermetically seal the solar panel and maintain the vacuum. The vacuum may be maintained for a lifetime of operation of the solar panel, which may be 20 years or greater, 30 years or greater, 40 years or greater, or even 50 years. In example the vacuum comprises a pressure of $10^{-7}$ Pascal or less, thereby maintaining an interior of the solar panel under negative pressure with respect to atmospheric pressure of $10^{-7}$ Pascal or less over time.

In an example, the one or more wires may comprise a cathode and an anode.

The one or more wires may comprise oxygen free solid copper wire. The one or more wires may be insulated with a vacuum-tolerant material within the interior region of the solar panel. As a representative example, the vacuum-tolerant material may be polytetrafluoroethylene.

In some examples, the interface between the portions of the glass housing (e.g., the plurality of glass sides and the bottom surface of the glass top structure) may be surface prepared to facilitate interaction between the plurality of glass sides and the bottom surface of the glass top structure. For example, the surface preparation may increase a surface area for interaction between the plurality of glass sides and the bottom surface of the glass top structure. In some examples, the surface preparation may create bumps or other protrusions of various shapes on one surface that fit into grooves or holes on another surface.

In some examples, the film that encapsulates the one or more photovoltaic cells may comprise one or more of polychlorotrifluoroethylene (PCTFE), polyethylene (PE), ethylene vinyl alcohol (EVOH), polyvinylidene chloride (PVCD), polyisobutylene, a poly(p-xylylene) polymer and/or aluminum oxide plus zirconium oxide. In some examples, the film may be of a material thickness that is less than 0.1 mm and may fit into the glass bottom structure with an overall tolerance of 0.05 mm or less between the film and glass sides. The tolerance is small so there is a snug fit between the photovoltaic material and the glass enclosure. It also helps to maximize the photovoltaic surface in relation to the solar panel size.

In some examples, the solar panel may be planar. However, in other examples, the solar panel may be a non-planar shape, such as a space curve. The one or more photovoltaic cells may comprise one or more of single junction perovskite cells, multiple junction perovskite cells, tandem cells, heterogeneous cells comprised of silicon and perovskite, and heterogeneous cells comprised of gallium arsenide and perovskite.

In some examples, the one or more hermetically sealable ports and the one or more hermetically sealable holes may be sealable by way of laser welding or via use of an ultra-high vacuum epoxy with low outgassing.

In another embodiment, a method of assembling a solar panel of the present disclosure comprises surface-preparing an interface between first and second portions of a glass housing (e.g., a glass top structure and a glass bottom structure). In some embodiments, the interface may at least partially comprise a top surface of one or more side walls of the glass bottom structure and a bottom surface of the glass top structure. The method may further comprise encapsulating a solar cell with a film. The method may further comprise positioning the solar cell within the glass bottom structure. The method may further comprise threading one or more wires stemming from the solar cell through one or more hermetically sealable holes in a bottom plane of the glass bottom structure. The method may further comprise hermetically sealing the glass top structure to the glass bottom structure. The method may further comprise hermetically sealing the one or more hermetically sealable holes in the bottom plane of the glass bottom structure through which the one or more wires penetrate. The method may further comprise evacuating the solar panel to a vacuum of $10^{-7}$ Pascal or less via one or more hermetically sealable ports included in the glass bottom structure, and hermetically sealing the one or more hermetically sealable ports following evacuation of the solar panel to the vacuum of $10^{-7}$ Pascal or less.

In an example of the method, laser welding techniques may be used to hermetically seal the glass top structure to the glass bottom structure.

In another example of the method, hermetically sealing the one or more sealable holes in the bottom plane of the glass bottom structure may be via an ultra-high vacuum epoxy with low outgassing or via laser welding.

In another example of the method, hermetically sealing the one or more hermetically sealable ports further may further comprise inserting a glass plug at least partially into the one or more sealable ports, and hermetically sealing the one or more hermetically sealable ports via an ultra-high vacuum epoxy with low outgassing or via laser welding.

In another example of the method, the method may further comprise surface-preparing the interface between the glass top structure and the glass bottom structure. In example, the surface preparing may be via a micro-electro-mechanical system process.

In another example of the method, the solar cell may be comprised of one of single junction perovskite cells, multiple junction perovskite cells, heterogeneous cells comprised of silicon and perovskite, tandem cells, and heterogeneous cells comprised of gallium arsenide and perovskite.

In another example of the method, the film may include one or more of PCTFE, PE, EVOH, PVCD, polyisobutylene, aluminum oxide plus zirconium oxide and/or a poly(p-xylylene) polymer.

In yet another embodiment, a solar panel may comprise one or more solar cells that include perovskite, the one or more solar cells encapsulated by a film comprised of one or more of PCTFE, PE, EVOH, PVCD, polyisobutylene, aluminum oxide plus zirconium oxide and/or a poly(p-xylylene) polymer, and may further comprise a glass exterior that houses the one or more solar cells and which is hermetically sealed to maintain a vacuum in an interior of the solar panel of $10^{-7}$ Pascal or less.

Turning now to the Figures, FIG. 1 is an exploded view 100 of a type of silicon solar panel currently utilized. Solar panels today have an architecture that is a layer cake of materials. Various sealants are used to cover the edges of the panel, and a metal frame clamps around the edges holding everything together. As shown at FIG. 1, a top glass 100 may be tempered and with a low iron content. A second layer 102, may be ethyl vinyl acetate (EVA), and may comprise a waterproof encapsulate. A third layer 104 comprises silicon solar cells. Under the silicon solar cells is another protective layer (e.g., fourth layer 106) of EVA. A fifth layer 108 may be glass or a laminate (not shown). In the case of laminates, laminates make up generally three layers. For example, the top adheres to the EVA, the bottom is a waterproof backing, and the middle sticks these two layers together.

Around this layer cake is a seal 122, and the entire assembly is held together in a frame 120, for example a metal frame (e.g., aluminum). Not shown is an enclosure box beneath the panel where electrical integration occurs. Such an enclosure box may carry a rating of IP-54 (International Protection-54). The first digit (5) represents the level of protection the enclosure provides against solid bodies, and the second digit (4) describes the degree of protection of the equipment inside the enclosure against water. Enclosure boxes with an IP-54 rating protect from limited dust ingress and water spray from any direction, however there is limited water ingress protection.

Figure 2A:
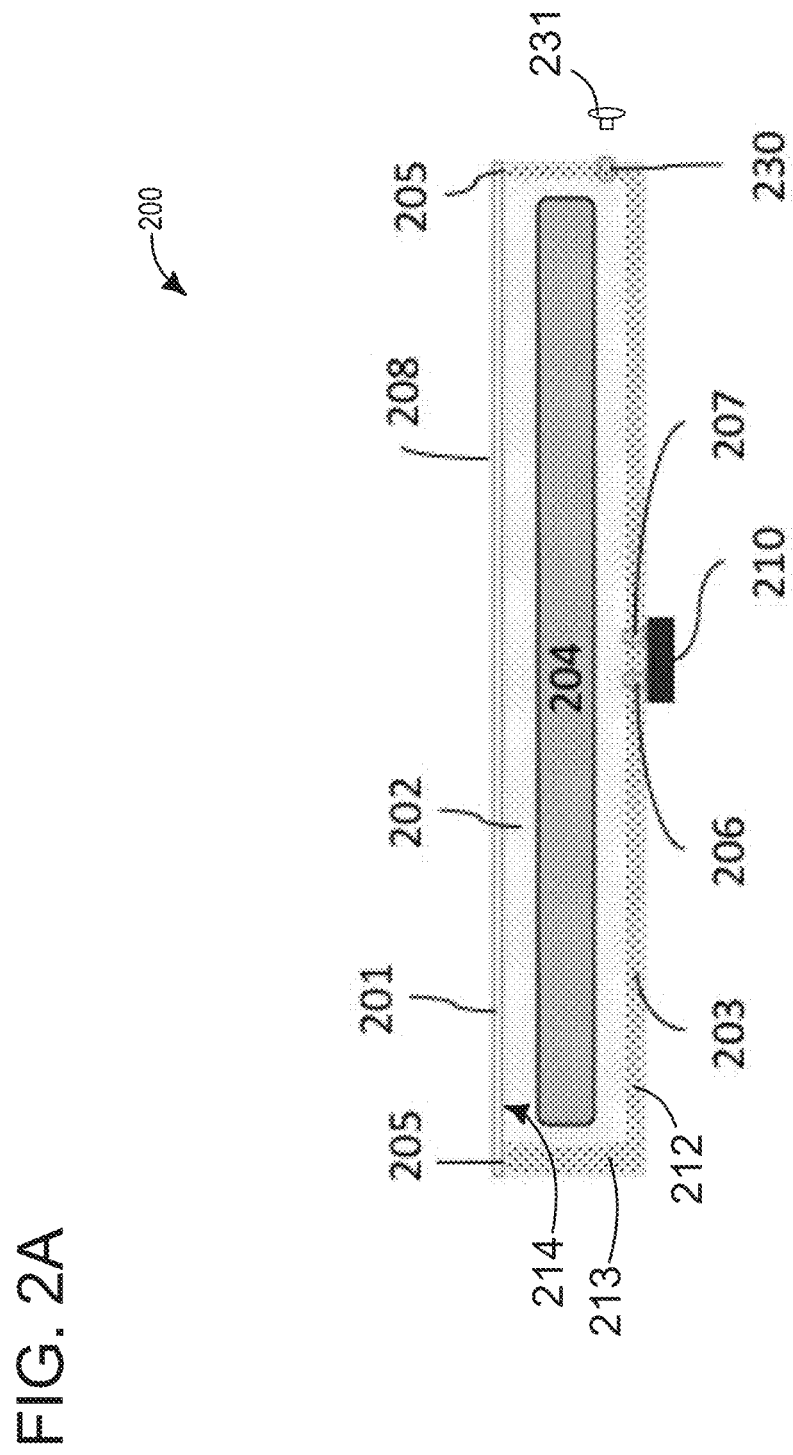
FIG. 2A depicts a glass solar panel of the present disclosure for housing a perovskite-based solar cell.

FIG. 2A shows a durable solar panel 200 of the present disclosure for perovskite solar cells. A glass top structure 201 may comprise tempered glass with low iron content, and an anti-reflective outer surface 208. More specifically, the glass top structure 201 may comprise solar energy glass, also referred to herein as low-iron glass. This glass may be understood to comprise a high-clarity glass that is made from silica with low amounts of iron. Low-iron glass typically has a ferric oxide content of about 0.01%. This low level of iron removes a greenish-blue tint that can otherwise be seen particularly on larger and thicker sizes of glass. Low-iron glass can be used for a variety of industrial applications, including use in solar panels (due to high transmissivity). Low-iron glass is made from low-iron silica sand.

The glass top structure 201 attaches to a glass bottom structure 203, at interface 205. Glass bottom structure 203 may include a bottom plane 212 and a plurality (e.g., four) of glass side walls 213. It may be understood that the bottom plane 212 and the plurality of glass side walls 213 may comprise a single glass piece. In other words, the glass side walls 213 are integral to the bottom plane 212, and thus glass bottom structure 203 may be understood to comprise a box-like structure without a top (until the glass top structure is attached thereto). Interface 205 may be understood to represent the interface between a top surface (not specifically shown) of the plurality of glass side walls 213 and a bottom surface 214 of glass top structure 201. This interface at 205 may be welded together all around the top of glass bottom structure 203 by laser welding. Laser welding as discussed herein may comprise, as an example, ultra-short pulsed (USP) glass welding. The use of laser welding may enable a hermetic and water-proof seal between the glass top structure 201 and the glass bottom structure 203. The surfaces may be prepared using any technology that facilitates a hermetic weld between the two glass surfaces by laser. One example preparation may comprise use of micro-electro-mechanical systems (MEMS) technology. The glass top structure 201 may be transparent while the bottom glass structure 203 may comprise a type of structural glass that need not be transparent. In some examples the bottom structure may not be glass, but instead may be metal (e.g., aluminum, steel, etc.), without departing from the scope of this disclosure. In either case, laser welding may be used, or additionally or alternatively an ultra-high vacuum epoxy with low outgassing may be used to hermetically seal the top structure to the bottom structure.

The photovoltaic material or solar cells 204 may require protection from moisture and oxygen while the solar panel is being constructed. The photovoltaic material 204 may be single junction perovskite cells, multiple junction perovskite cells (e.g., two or more p-n junctions of different materials), tandem cells (e.g., two or more p-n junctions of same materials), or in other examples heterogeneous cells made of silicon and perovskite, or gallium arsenide and perovskite. Discussed herein, p-n junctions may be understood to comprise a boundary or interface between two types of semiconductor materials, p-type and n-type. The "p" side may contain an excess of holes, while the "n" side may include an excess of electrons in the outer shells of the electrically neutral atoms there. The solar cells 204 may be encapsulated with one or more films 202 that have high transmissivity to visible light (e.g., 90% transmissivity or greater), are highly moisture resistant (e.g., water vapor transmission rates of 0.015 g/(m² d) or less at 38° C. and 90% relative humidity), and highly oxygen resistant (e.g., oxygen transmission rates of 0.250 cm³/(m² d) at 23° C. and 50% relative humidity).

A number of materials may be used to meet these criteria. Table 1 below shows examples of this and the terms used are: polychlorotrifluoroethylene (PCTFE), polyethylene (PE), ethylene vinyl alcohol (EVOH), polyvinylidene chloride (PVcD), a poly(p-xylylene) polymers referred to as parylene-c, polyisobutylene, and aluminum oxide plus zirconium oxide ($Al_2O_3+ZrO_2$). Shown in the table below are the water vapor transmission rates (WVTR) and the oxygen transmission rates (OTR) of barrier film solutions for the photovoltaic material. The WVTR are given in g/(m² d) at 38° C. and 90% relative humidity (RH). The OTR are given in cm³/(m² d) at 23° C. and 50% RH. Transmissivity is in the optical wavelength range of 400 nm to 1200 nm.

It may be understood that the methods of manufacture and the economics of the film materials may differ. For example parylene-c is a conformal coating, while PCTFE is a thin film that may be thermoset. Polyisobutylene is thermoset. The aluminum zirconium barrier may be laid down using atomic layer deposition.

TABLE 1

Attributes of various film materials.

| Barrier Film | WVTR | OTR | Thickness | Transmissivity |
| --- | --- | --- | --- | --- |
| PCTFE PE-EVOH-PE | 0.015 | 0.250 | 150 μm | 92% |
| PCTFE PVcD | 0.015 | 0.178 | 125 μm | 93% |
| Parylene-c PVcD | <1.0 × 10⁻⁵ | 0.178 | 26 μm | 96% |
| Polyisobutylene | 0.001 | 0.045 | 50 μm | 92% |
| $Al_2O_3+ZrO_2$ | 4.7 × 10⁻⁵ | 0.021 | 0.13 μm | 93% |

TABLE 1-continued

Electrical device 210 (e.g., electrical enclosure device) which may comprise an electronic circuit is shown at FIG. 2A and may comprise a dust and water resistant electrical enclosure. Hermetically sealable ports 230 may comprise small ports that penetrate through the bottom glass structure 203. As depicted at FIG. 2A, hermetically sealable ports 230 may be included as part of glass side walls 213 in some examples. Additionally or alternatively, hermetically sealable ports 230 may be included as part of bottom plane 212. Hermetically sealable ports 230 may be used to generate a high magnitude vacuum (e.g., negative pressure with respect to atmospheric pressure) in an interior of solar panel 200 measuring in the range of $10^{-7}$ Pascal or lower. More specifically, the ports 230 may provide a pathway to communicate a vacuum to the interior of solar panel 200. Once the vacuum is achieved, glass plugs 231 may be inserted into hermetically sealable port(s) 230. In some examples, a hermetic laser weld may then be created between the glass plug(s) 231 and the hermetically sealable port(s) 230. In another example, the hermetically sealable port(s) 230 may receive the glass plug(s) 231, and then may be sealed via use of an ultra-high vacuum epoxy with very low outgassing. Examples of such ultra-high vacuum epoxies with low outgassing include but are not limited to epoxy adhesive systems that can be used at pressures down to $1\times10^{-12}$ torr or less. Such formulations (e.g., MasterBond, Hackensack, N.J.) may have low outgassing so as to avoid contamination, weight loss and/or degradation, even at elevated temperatures. Low outgassing is defined as passing the industry standard test for measuring outgassing in materials—American Society for Testing and materials (ASTM) E595. Developed by NASA to screen low-outgassing materials for use in space, the test determines the volatile content of material samples placed in a heated vacuum chamber. Briefly, samples to be tested are first preconditioned at 50 percent relative humidity for 24 hours and weighed. The samples then go into a test chamber for another 24 hours with the temperature set at 125° C. and a vacuum at a minimum of $5\times10^{-5}$ Torr. During that time in the test chamber, volatiles that outgas from the sample escape through a port in the test chamber and condense on a cooled (25° C.) collector plate. The sample and condensate on the collector plate are then weighed to determine the total mass lost (TML) by the sample and the amount of collected volatile condensable materials (CVCM) on the collector plate. Materials pass or fail the test based on these TML and CVCM measurements. If the CVCM exceeds 0.1 percent, the material fails. The material will also fail if the TML exceeds 1 percent, although the TML may be offset by water vapor regained (WVR) by the sample in a subsequent measurement. Accordingly, if the CVCM is less than 0.1 percent and the TML is less than 1 percent, the material passes. If the CVCM is less than 0.1 percent and the TML is greater than 1 percent, the material may pass if the TML-WVR is less than 1 percent. If the CVCM is greater than 0.1 percent, or the TML-WVR is greater than 1 percent, the material fails the test.

The photovoltaic material 204 may be connected to the electrical device 210, via one or more hermetically sealable holes (206, 207) in the bottom glass structure 203, for example in bottom plane 212. As an example, a first hermetically sealable hole 206 may correspond to a photovoltaic material anode, and a second hermetically sealable hole 207 may correspond to a photovoltaic material cathode. As an example, the cathode and anode may comprise copper wire. In some examples, the copper wire may be solid 8 gauge, oxygen free (OF) copper wire. Specifically, the copper wire may not comprise twisted copper wire because twisted copper wire may leak atmosphere, in contrast to solid copper wire (non-twisted) which may not. While two hermetically sealable holes are depicted, in some examples just one hermetically sealable hole may be used, without departing from the scope of this disclosure. The wire connections between the photovoltaic material 204 and the electrical device 210, are not shown for clarity. However, it may be understood that the portion of the electrical wire that is within the interior of solar panel 200 may be insulated with a vacuum-tolerant material. In an example, the vacuum-tolerant (e.g., vacuum-resistant) material may be polytetrafluoroethylene (PTFE) or Teflon™. Once the wires (e.g., solid 8 gauge OF copper wire) are positioned through the hermetically sealable holes (e.g., hermetically sealable holes 206, 207), the holes may be sealed using an ultra-high vacuum epoxy with very low outgassing, similar to that discussed above. In other examples, the hermetically sealable holes may be sealed using molten glass.

While not explicitly illustrated at FIG. 2A, it may be understood that the cathode may comprise a top of the photovoltaic material 204 (e.g., closer to glass top structure 201), and the anode may comprise a bottom of the photovoltaic material (e.g., closer to glass bottom structure 203). It may be further understood that in perovskite-based cells, the cathode may be a transparent ceramic thin film that is a conductor.

It may be understood that FIG. 2A shows just an example embodiment of a solar panel 200 of the present disclosure. For example, hermetically sealable holes (e.g., 206, 207) may be positioned anywhere on bottom plane 212, or even side walls 213 as opposed to being centered on bottom plane 212. Similarly, the hermetically sealable port(s) 230 may be located anywhere on solar panel 200. Furthermore, it is herein recognized that in some examples it may be possible to avoid including the one or more hermetically sealable port(s) 230, relying on just the hermetically sealable holes (e.g., 206, 207). Specifically, it may be possible to avoid including the one or more hermetically sealable port(s) 230 in a case where solar panel 200 can be entirely assembled in a vacuum (e.g., under vacuum conditions).

Figure 2B:
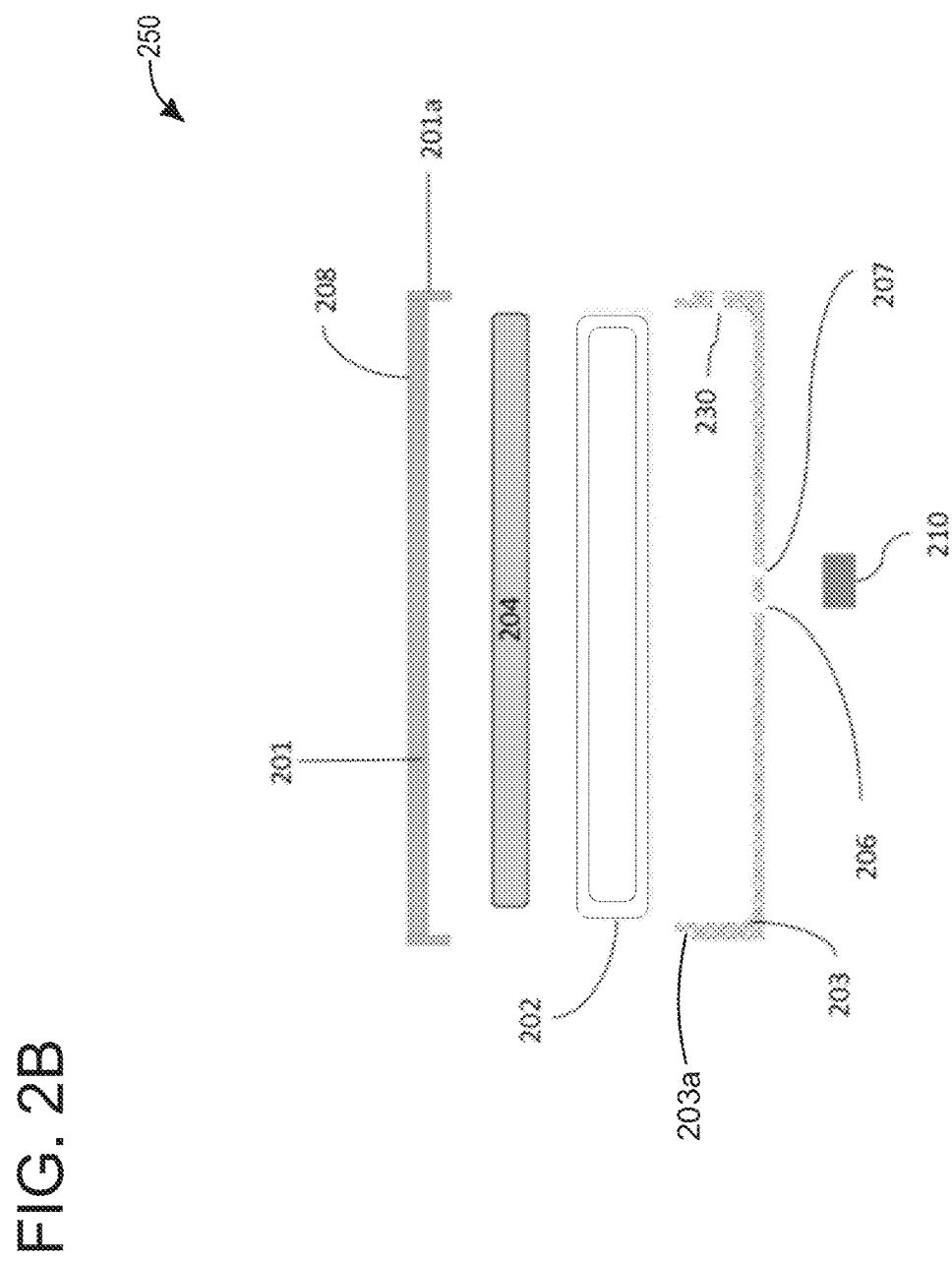
FIG. 2B depicts an exploded view of the glass solar panel of FIG. 2A.

FIG. 2B depicts an exploded view 250 of FIG. 2A. Numerals common to FIG. 2A and FIG. 2B are not described again for brevity. In some examples, glass top structure 201 may include an edge piece 201a, that fits into a groove 203a of glass bottom structure 203. However, in other examples, edge piece 201a may fit over an exterior of glass bottom structure 203, without relying on groove 203a, without departing from the scope of this disclosure. Edge piece 201a may extend all around glass top structure 201, for fitting over glass bottom structure 203. Edge piece 201a may additionally provide a protective area for the interior of the solar panel, which may be useful depending on the attachment methodology. In the case where a laser weld is utilized, edge piece 201a may not be used in some examples, but may additionally be used in other examples. In a case where a MEMS technique and a chemical methodology is used for joining the glass top structure to the glass bottom structure, then increased surface area and protection may be warranted, achievable via the use of edge piece 201a.

Figure 3C:
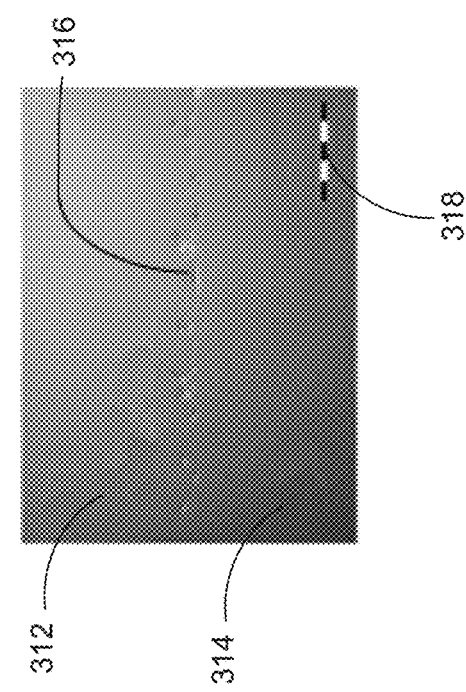
FIG. 3C depicts an x-ray image of a glass-glass laser weld.
Figure 3A:
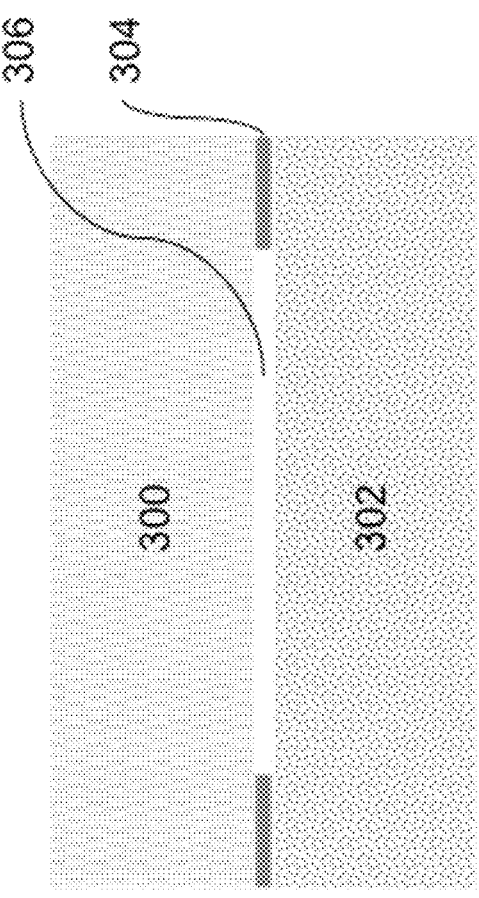
FIG. 3A illustratively depicts an adhesive weld between two glass surfaces.
Figure 3B:
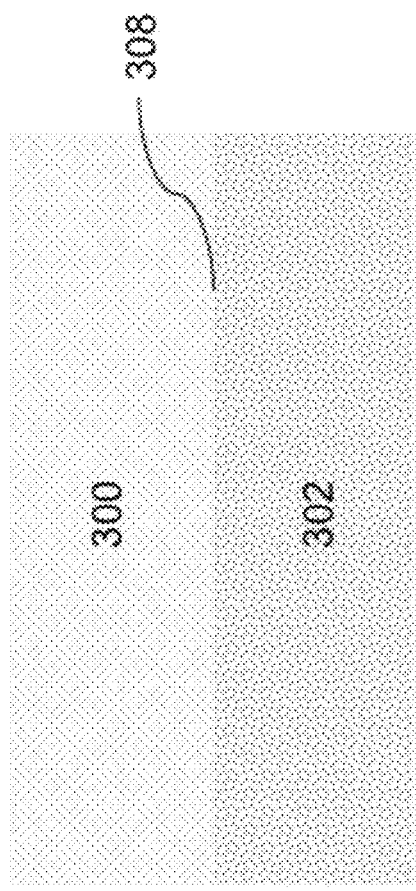
FIG. 3B illustratively depicts a laser weld between two glass surfaces.

FIGS. 3A-3C illustrate comparisons between a laser weld and an adhesive bond between glass and glass. At FIG. 3A, depicted is a low iron glass top 300 (e.g., same as glass top structure 201 in FIGS. 2A-2B) and a non-transparent glass bottom 302 (e.g., same as glass bottom structure 203 in FIGS. 2A-2B). An adhesive 304 (e.g., n-butyl cyanoacrylate) is shown between the glass layers holding them together. When using adhesive 304, an air gap 306 between the layers may result. It may be understood that air gap 306 represents an exaggerated air gap for illustrative purposes.

Alternatively, FIG. 3B depicts the low iron glass top 300 laser welded to the non-transparent glass bottom 302. A lack of any air gap is illustratively shown by numeral 308.

FIG. 3C depicts image 310 comprising an x-ray image of a glass-glass bond between a first glass 312 (e.g., same as low iron glass top 300) and a second glass 314 (e.g., same as non-transparent glass bottom 302). The interphase bond 316 between the first glass 312 and the second glass 314 after laser welding is shown. Scale bar 318 represents 50 µm.

As mentioned above, one drawback to adhesives is that they outgas, which may result in degradation (e.g., loss) of vacuum. Thus, while the adhesive 304 may be sufficient to structurally hold the glass-glass material together, the laser weld may result in a stronger bond, a superior barrier to water and moisture ingress, and importantly, may enable solar panels of the present disclosure to maintain a desired vacuum (e.g., less than $10^{-7}$ Pascal) for a longer time (e.g., as long as 50 years) as compared to the use of adhesives.

FIGS. 4A-4B show a potential MEMS configuration for laser welding or epoxy fastening of surface 400 to surface 402. FIG. 4A shows surface 400, which may correspond to a first glass structure (e.g., glass top structure 201 in FIGS. 2A-2B). FIG. 4B shows surface 402, which may correspond to a second glass structure (e.g., glass bottom structure 203 in FIGS. 2A-2B). 404 shows the scale of the preparation to be 1 µm. Such an example is meant to be illustrative, and any variety of different protruding shapes and receiving grooves may be utilized without departing from the scope of this disclosure. Within the scope of this disclosure for surface preparation is surface micromachining, which may use a succession of thin film deposition and selective etching. Another example within the scope of this disclosure is bulk micromachining, including creating structures by selectively etching inside a substrate. In some examples, some combination of surface micromachining and bulk micromachining may be used. Other additional or alternative examples for surface preparation include but are not limited to wet chemical etching, isotropic etching, anisotropic etching, hydrofluoric etching (HF etching), electrochemical etching, dry etching, and the like.

Also within the scope of this disclosure are methods for bonding polymers to other substances, such as low iron glass, for example. Etching may be performed to increase the surface area for bonding. A chlorine type wash may be used on the glass, to remove sodium atoms from the surface or a positive charge can be used to drive the sodium atoms away. Electrons may be removed from the surface of the polymer, creating molecular positive bumps. When thermoset under light compression, the bumps may be compressed into holes, and when cured may form a hermetic seal.

Also within the scope of this disclosure are methods for bonding glass to glass. A preferred methodology is referred to as wafer bonding. It may be understood that glass bonding may comprise a micromachining method that is analogous to welding in the macroscale world and involves the joining of two or more glass components. The two methods of glass bonding relevant to the present disclosure are direct or fusion bonding and field-assisted or anodic bonding.

Figure 5:
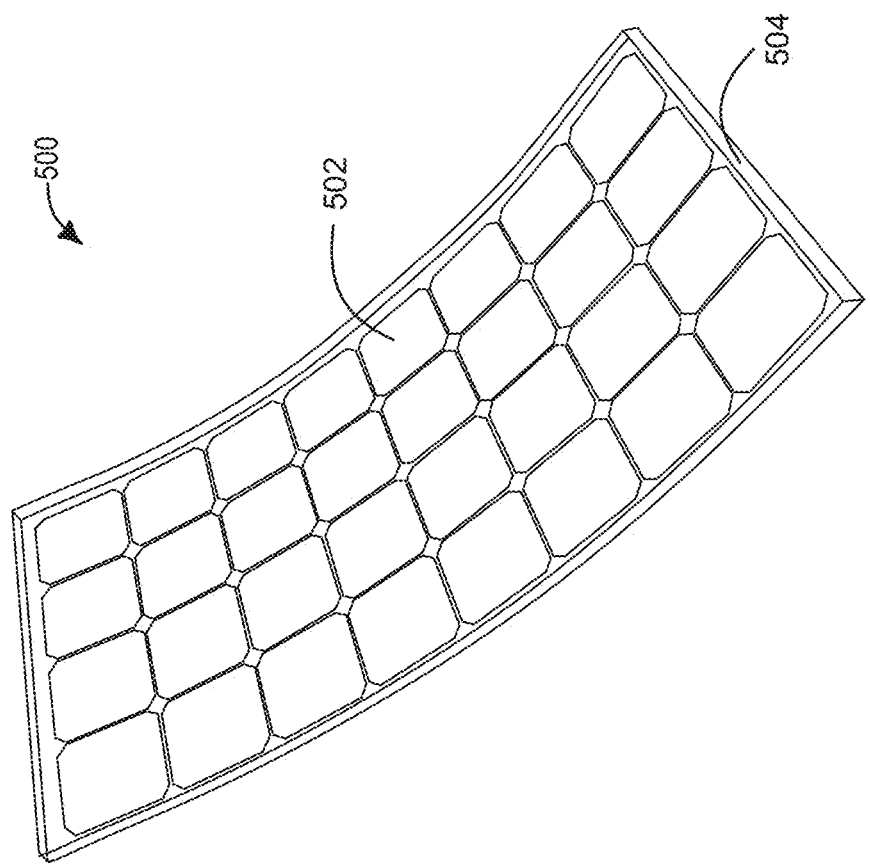
FIG. 5 shows a glass solar panel in a space curve.

FIG. 5 depicts a glass solar panel 500 (e.g., similar to or the same as solar panel 200 in FIGS. 2A-2B) of the present disclosure in a space curve. A space curve may be understood to be a curve that may pass through any region of three-dimensional space, as contrasted to a plane curve, which must lie on a single plane. Space curves may be understood to be a very general form of curves. Space curves or 3-dimensional curves may be useful if the photovoltaic panel is required to be curved for some reason. It may be understood that, while not explicitly illustrated at FIG. 5, solar panel 500 may include any and all components and aspects discussed above with regard to FIGS. 2A-2B. In other words, the glass solar panel 500 which is shown as a space curve may be understood to function and be comprised of same components as those discussed above with regard to FIGS. 2A-2B. It may be understood that the curved solar glass panel depicted at FIG. 5 is curved in order to perform some functionality. Examples include but are not limited to following a curvature of a roof of a structure, part of an automobile (e.g., trunk, roof, hood, etc.), and the like. The photovoltaic layer 502 is depicted as being curved, and thus may be understood to have to be perovskite-based or a type of flexible thin film. Also depicted is the glass encasement 504 (e.g., glass top structure and glass bottom structure secured to one another). However, it is herein recognized that in some examples an all glass panel may be unnecessarily heavy for particular applications (e.g., use with an automobile). Thus, in some embodiments discussed herein it may be understood that the bottom structure may be comprised of metal (e.g., aluminum, steel, etc.), while the top structure may be comprised of glass. It is within the scope of this disclosure to use ultra-high vacuum epoxy to securely join glass and aluminum or glass and steel, particularly when interface surfaces are prepared using MEMS techniques. Additionally or alternatively, laser welding may be used to permit the joining of glass and aluminum or glass and steel, in a manner that remains very secure (e.g., hermitically sealed) in a temperature range of −40° C. to 90° C. (−40° F. to 194° F.). This is quite adequate for exterior structures or automobiles for most of the planet.

Figure 6:
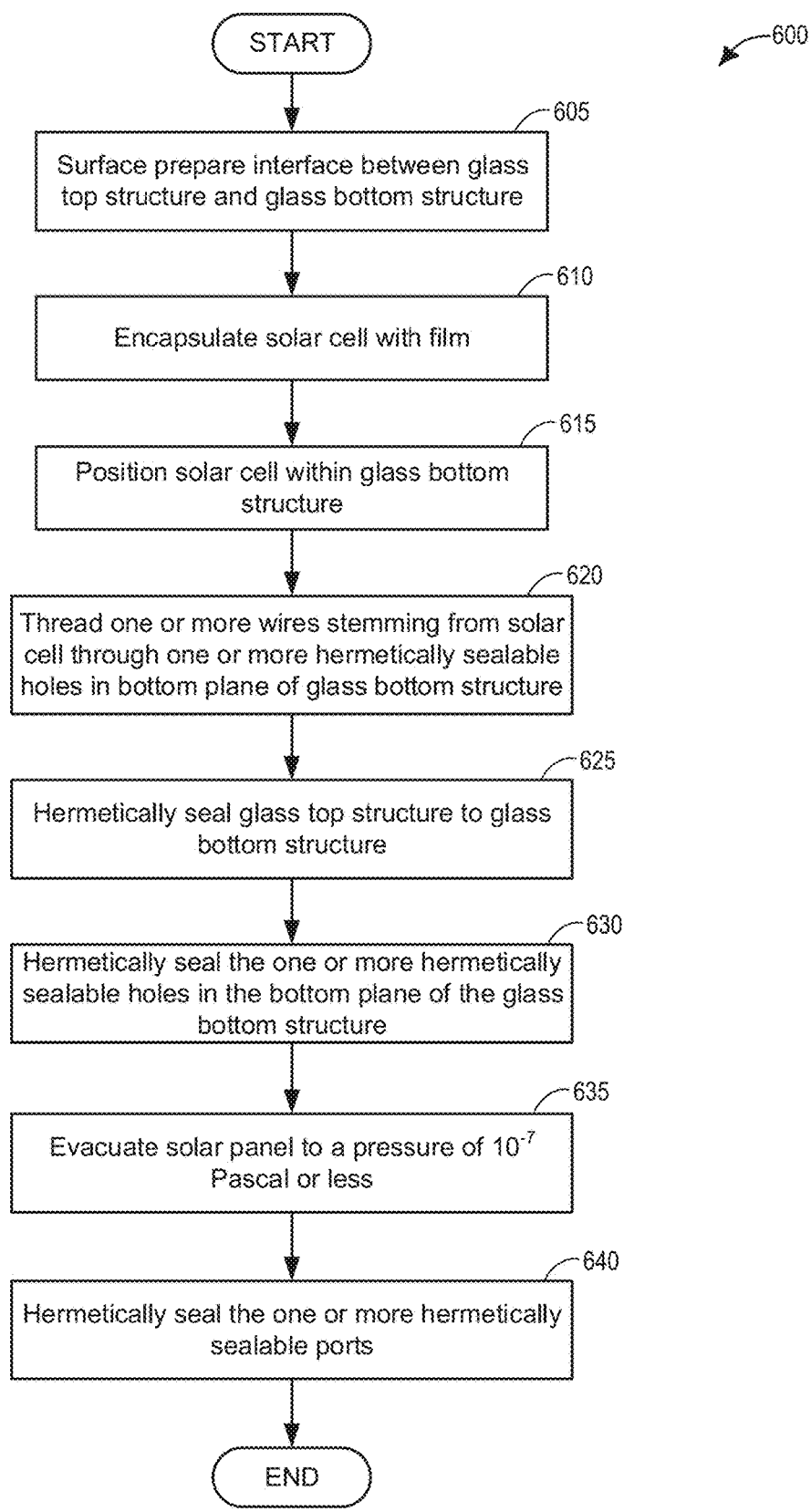
FIG. 6 depicts a high-level example method for assembling a solar panel of the present disclosure.

Turning now to FIG. 6, depicted is a high-level example method 600 for assembling a solar panel of the present disclosure. In some examples, one or more steps of method 600 may be carried out manually. In other examples, one or more steps may be carried out manually and one or more other steps may be carried out by an assembly system. In still other examples, all steps of method 600 may be carried out by an assembly system. Briefly, turning to FIG. 7, such an assembly system may include a control system 714 comprising a controller 712 capable of receiving one or more signals from one or more sensors 718, and capable of sending one or more signals to one or more actuators 721 in order to at least partially (or in some cases entirely) assemble a solar panel of the present disclosure.

Depicted at FIG. 7 is assembly system 750, including an object manipulation system 760 and a vision system 770. It may be understood that each of object manipulation system 760 and vision system 770 may include a wide variety of appropriate sensors 718 and actuators 721. Controller 712 may receive input data from the various sensors, process the input data, and trigger the actuators in response to the processed input data based on instructions or code programmed therein corresponding to one or more routines (e.g., control routine 600 at FIG. 6).

It may be understood that controller 712 may be communicably coupled to sensors and/or actuators of object manipulation system 760 and/or vision system 770 via one or more of a wireless network, wired network, or a combination of wired and wireless networks. Suitable networks include, but are not limited to, the Internet, a personal area network, a local area network (LAN), a wide area network (WAN) or a wireless local area network (WLAN), for example. Network devices (not shown) may include local area network devices such as routers, hubs, switches, or other computer networking devices.

Object manipulation system 760 may include one or more end-effectors 761. In the field of robotics, an "end-effector" (also known as end-of-arm tooling (EOAT)) is a portion of a robot that interacts with an environment outside of, or separate from, the robot. For example, an end-effector of a robotic kinematic chain may be a portion of the robot that has an attached tool. One example may include impactive tools that can physically grasp a particular object. Examples of impactive tools can include but are not limited to clamps, grippers, jaws, claws or the like. Another example of an attached tool may comprise tools that pierce or physically penetrate an object's surface. Such tools may be referred to as ingressive tools. Examples include but are not limited to pins and needles, or the like. Another example of an attached tool may include tools that apply an attractive force or forces to the surface of a particular object. Such tools may be referred to as astrictive tools, and may include but are not limited to vacuum or suction-based tools, tools that rely on electroadhesion, tools that rely on magnetism, etc. Yet another example of an attached tool includes tools that use direct contact for adhesion. Such tools may be referred to as contigutive tools. Examples include but are not limited to tools that make use of surface tension, freezing, gluing, or the like. Still another example of an attached tool may include tools that employ some force to bring the end-effector and object close to one another. Such tools may be referred to as contactless tools. Examples may include but are not limited to Bernoulli grippers, electrostatic grippers and van der Waals grippers, ultrasonic grippers, laser grippers, capillary grippers, or the like.

It may be understood that end-effectors 761 according to the present disclosure may in some examples comprise a laser source that can be controlled in a manner so as to laser weld one piece of glass to another piece of glass. Additionally or alternatively, end-effectors 761 may in some examples comprise an end-effector capable of applying an epoxy or other adhesive material to hermetically seal one or more aspects of solar panels of the present disclosure. Additionally or alternatively, end-effectors 761 may include one or more tools as mentioned above capable of manipulating one or more components of the solar panels of the present disclosure during assembly thereof. For example, an end-effector may comprise an impactive tool that physically positions a glass top structure (e.g., glass top structure 201 in FIGS. 2A-2B) atop a glass bottom structure (e.g., glass bottom structure 203 in FIGS. 2A-2B). In another example, an end-effector may be capable of maneuvering one or more solar cells into position within the glass bottom structure. Such examples are meant to be illustrative, and it may be understood that object manipulation system 760 may be controlled in a manner to carry out any aspect of solar panel assembly as discussed herein. Examples of sensors that may be included as part of object manipulation system 760 may include but are not limited to pressure sensors, temperature sensors, ultrasonic sensors, light-based sensors (e.g., LIDAR), movement sensors, position sensors and the like. Examples of actuators that may be included as part of object manipulation system 760 may include but are not limited to motors, valves (e.g., solenoid-actuated valves), switches and the like.

Vision system 770 may similarly include any combination of sensors (e.g., sensors 718), actuators (e.g., actuators 721), mechanical parts, etc., that enable vision system 770 to communicate to controller 712 information pertaining to components of a solar panel of the present disclosure for selecting and manipulating. In some examples, vision system 770 may include one or more cameras for obtaining still images and/or video images. Vision system 770 may obtain images corresponding to solar panel components, and may communicate such images to controller 712. In some examples, controller 712 may include software for recognizing particular objects, types of objects, objects of certain material, objects of certain dimensions, etc., and such information may be communicated to object manipulation system 760 such that one or more end-effector(s) 761 may be controlled to manipulate said objects in a desired manner (e.g., manner programmed into a memory of controller 712). In this way, assembly system 750 may be utilized to assemble solar panels of the present disclosure according to the methodology of FIG. 6.

Returning now to FIG. 6, it may be understood that any number of steps of method 600 may be stored as executable instructions in non-transitory memory of a controller, such as controller 712 depicted at FIG. 7. Method 600 is described herein with reference to FIGS. 2A-5 and FIG. 7, though it should be understood that the method may be applied to other systems without departing from the scope of this disclosure. Furthermore, it may be understood that the steps of method 600 as shown do not have to be conducted exactly in the order shown, but rather certain steps shown occurring after another step may instead be conducted before that step, without departing from the scope of this disclosure.

Method 600 begins at 605, and includes surface preparing an interface (e.g., interface 205 at FIG. 2A) between a glass top structure (e.g., glass top structure 201 at FIGS. 2A-2B) and a glass bottom structure (e.g., glass bottom structure 203 at FIGS. 2A-2B). It may be understood that surface preparing the interface may render the interface more amenable to formation of a hermetic seal between the glass top structure and the glass bottom structure, either by way of an ultra-high vacuum epoxy or via laser-welding. In some examples, MEMS technology may be utilized to create a desired patterning of selected shapes and dimensions (see for example FIGS. 4A-4B), so as to facilitate formation of a hermetic seal. However, it may be understood that surface preparing the interface is not limited to the use of MEMS technology. Other techniques for etching glass may be used to increase surface area contact between the glass top structure and the glass bottom structure in order to facilitate formation of a hermetic seal, either by way of ultra-high vacuum epoxy or via laser welding.

At 610, method 600 includes encapsulating a solar cell within a film. Discussed herein, the solar cell may comprise one or more of single junction perovskite cells, multiple junction perovskite cells, tandem cells, heterogeneous cells comprised of silicon and perovskite, and/or heterogeneous cells comprised of gallium arsenide and perovskite. The film may be understood to have properties of high transmissivity to visible light (e.g., 90% transmissivity or greater), high moisture resistance (e.g., water vapor transmission rates of 0.015 g/(m² d) or less at 38° C. and 90% relative humidity), and high oxygen resistance (e.g., oxygen transmission rates of 0.250 cm³/(m² d) at 23° C. and 50% relative humidity). The solar cell may be encapsulated by the film in a manner that cures without edges (e.g., zero edges), such that the film has a substantially continuous and similar/same material structure throughout (e.g., apart from some material defects that may occur) and entirely surrounds the solar cell (e.g., apart from electrical wires, such as anode and cathode wires, that may penetrate the film). Additionally, or alternatively, the film may have a material width (e.g., thickness) of less than 0.1 mm. The solar cell may be encapsulated within the film in a manner that allows for the film-encapsulated solar cell to fit into the glass bottom structure with an overall tolerance of 0.05 mm or less. In other words, a maximum amount of variation in the thickness of the film may be 0.05 mm or less overall. This ensures all components fit together properly in an automated assembly process and to achieve the visual esthetic requirements for external adjacent automotive parts (viz. hood and fender).

The film for encapsulating the solar cell may be comprised of one or more of polychlorotrifluoroethylene (PCTFE), polyethylene (PE), ethylene vinyl alcohol (EVOH), polyvinylidene chloride (PVCD), poly(p-xylylene) polymers referred to as parylene-c, aluminum oxide plus zirconium oxide, and polyisobutylene.

At 615, method 600 includes positioning the film-encapsulated solar cell within the glass bottom structure (e.g., glass bottom structure 203 in FIGS. 2A-2B). At 620, method 600 includes threading one or more wires, for example OF solid copper wires corresponding to an anode and a cathode of the solar cell, through one or more hermetically sealable holes (e.g., holes 206, 207 in FIGS. 2A-2B) established in the bottom plane (e.g., bottom plane 212 in FIGS. 2A-2B) of the glass bottom structure. While not explicitly disclosed in terms of method 600, it may be understood that the one or more wires may be insulated with a vacuum-tolerant (e.g., vacuum resistant) material within an interior of the solar panel. As an example, the vacuum-tolerant insulating material may comprise PTFE. Other examples include but are not limited to polyvinylidene fluoride, polyethylene, vespel polyimide, polycarbonates, polystyrene, PolyEtherEtherKetone (PEEK), etc.

It may be understood that the OF solid copper wires may be routed external to the solar panel to an electrical enclosure device (e.g., electrical enclosure device 210 in FIGS. 2A-2B), where electrical integration occurs. As an example, such an electrical enclosure device may carry a rating of IP-54, although other ratings are within the scope of this disclosure.

At 625, method 600 includes hermetically sealing the glass top structure (e.g., glass top structure 201 in FIGS. 2A-2B) to the glass bottom structure (e.g., glass bottom structure 203 in FIGS. 2A-2B). In one example, hermetically sealing the glass top structure to the glass bottom structure may be via laser welding. As discussed with regard to FIGS. 3A-3C, laser welding may enable a long-lasting waterproof and airtight seal without gaps. However, other methods of hermetically sealing the glass top structure to the glass bottom structure are within the scope of this disclosure. For example, in some embodiments, the glass top structure may be hermetically sealed to the glass bottom structure via use of an ultra-high vacuum epoxy with low outgassing.

At 630, method 600 includes hermetically sealing the one or more hermetically sealable holes through which the OF solid copper wire penetrates. Hermetically sealing said holes may be via use of an ultra-high vacuum epoxy with low outgassing, in an example. In another example, hermetically sealing said holes may be via use of molten glass, for example a molten glass plug.

At 635, method 600 includes evacuating the solar panel to a pressure of $10^{-7}$ Pascal or less. The evacuating at 635 may be via one or more hermetically sealable ports (e.g., hermetically sealable ports 230 in FIGS. 2A-2B). The one or more hermetically sealable ports may be included as part of glass side walls (e.g., glass side walls 213 in FIGS. 2A-2B). Additionally or alternatively, the one or more hermetically sealable ports may be included as part of the bottom plane (e.g., bottom plane 212 in FIGS. 2A-2B) of the glass bottom structure.

Responsive to formation of the desired vacuum ($10^{-7}$ Pascal or lower), at 640 the solar panel may be hermetically sealed thereby trapping the vacuum within the interior of the solar panel. Specifically, in one example, a glass plug (e.g., glass plug 231 at FIGS. 2A-2B) may be inserted into the hermetically sealable port(s), and a hermetic laser weld may then be created between the glass plug(s) and the hermetically sealable port(s). In another example, the hermetically sealable port(s) may be sealed via use of an ultra-high vacuum epoxy with low outgassing, similar to that discussed above.

While the methodology at FIG. 6 is discussed with regard to the bottom structure being glass, in other examples the bottom structure may be comprised of metal, without departing from the scope of this disclosure, and similar methodology may be used. Furthermore, in some examples the hermetically sealable holes and/or hermetically sealable ports may be surface prepared in similar fashion as that discussed above, to improve the hermetic sealability of said holes and ports.

Discussed herein is the utilization of perovskite materials to make photovoltaic cells that may be electrically interconnected to make a solar panel. In some examples, the solar panels of the present disclosure may have rectangular dimensions of 99 cm×164 cm×10 mm. In another example, the solar panels of the present disclosure may have rectangular dimensions of 99 cm×196 cm×14 mm. Other dimensions are within the scope of this disclosure. For example, rectangular dimensions spanning a range of 80-110 cm×150-220 cm×8-20 mm. A backing of such solar panels as discussed herein may comprise a metal, including but not limited to aluminum or steel. The metal backing may be selected based on the desired application, for example.

In this way, perovskite-based solar cells may be used to produce solar panels that can be used for decades without substantial degradation in terms of operability. The technical effect of hermetically sealing perovskite-based solar cells within an enclosure that traps a vacuum of $10^{-7}$ Pascal or lower (e.g., more negative than $10^{-7}$ Pascal with respect to atmospheric pressure) is that water ingress and thereby, degradation of the perovskite-based solar cells, may be avoided for decades of use.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A solar panel, comprising:
   one or more photovoltaic cells;
   a film that encapsulates the one or more photovoltaic cells;
   a glass housing, wherein the one or more photovoltaic cells encapsulated by the film is enclosed by the glass housing;
   one or more hermetically sealable ports in the glass housing for generation of a vacuum in an interior region of the solar panel;
   one or more hermetically sealable holes in the glass housing through which one or more wires couple the photovoltaic cell to an electrical device; and
   one or more glass plugs that fit at least partially into the one or more hermetically sealable ports to hermetically seal the solar panel and maintain the vacuum.

2. The solar panel of claim 1, wherein the vacuum comprises a pressure of $10^{-7}$ Pascal or less.

3. The solar panel of claim 1, wherein the one or more wires include a cathode and an anode, the cathode and the anode comprising oxygen free solid copper wire.

4. The solar panel of claim 1, wherein the one or more wires are insulated with a vacuum-tolerant material within the interior region of the solar panel.

5. The solar panel of claim 4, wherein the vacuum-tolerant material is polytetrafluoroethylene.

6. The solar panel of claim 1, wherein the glass housing further comprises:
   a glass bottom structure having a plurality of glass sides integral to a bottom plane of the glass bottom structure; and
   a glass top structure attached to the glass bottom structure by way of an interface between the plurality of glass sides and a bottom surface of the glass top structure.

7. The solar panel of claim 6, wherein the interface between the plurality of glass sides and the bottom surface of the glass top structure is surface prepared to facilitate interaction between the plurality of glass sides and the bottom surface of the glass top structure.

8. The solar panel of claim 6, wherein the film is of a material thickness that is less than 0.1 mm and fits into the glass bottom structure with an overall tolerance of 0.05 mm or less between the film and the glass sides.

9. The solar panel of claim 1, wherein the film is comprised of one or more of polychlorotrifluoroethylene (PCTFE), polyethylene (PE), ethylene vinyl alcohol (EVOH), polyvinylidene chloride (PVCD), polyisobutylene, aluminum oxide plus zirconium oxide, and/or a poly(p-xylylene) polymer.

10. The solar panel of claim 1, wherein the one or more photovoltaic cells comprise one or more of single junction perovskite cells, multiple junction perovskite cells, heterogeneous cells comprised of silicon and perovskite, and heterogeneous cells comprised of gallium arsenide and perovskite.

11. The solar panel of claim 1, wherein the one or more hermetically sealable ports and the one or more hermetically sealable holes are sealable by way of laser welding or via use of an ultra-high vacuum epoxy with low outgassing.

\* \* \* \* \*